(12) United States Patent
Cheng et al.

(10) Patent No.: US 8,096,836 B2
(45) Date of Patent: Jan. 17, 2012

(54) ELECTRICAL CONNECTOR WITH CONTACTS HAVING TAIL PORTIONS WITH A DIFFERENT PITCH THAN OR DISCRETE FROM CONTACT PORTIONS OF THE CONTACTS

(75) Inventors: Chih-Pi Cheng, Tu-Cheng (TW); Jia-Hau Liu, Tu-Cheng (TW)

(73) Assignee: Hon Hai Precision Ind. Co., Ltd, New Taipei (TW)

( * ) Notice: Subject to any disclaimer, the term of this patent is extended or adjusted under 35 U.S.C. 154(b) by 0 days.

(21) Appl. No.: 12/719,866

(22) Filed: Mar. 9, 2010

(65) Prior Publication Data
US 2010/0227507 A1    Sep. 9, 2010

(30) Foreign Application Priority Data
Mar. 9, 2009    (TW) ............................... 98203561 U

(51) Int. Cl.
*H01R 24/00*    (2011.01)
(52) U.S. Cl. ...................................................... 439/626
(58) Field of Classification Search .................. 439/66, 439/331, 884, 626
See application file for complete search history.

(56) References Cited

U.S. PATENT DOCUMENTS

| | | | | |
|---|---|---|---|---|
| 2,615,072 A * | 10/1952 | Gilbert et al. | ................. | 439/425 |
| 4,832,611 A * | 5/1989 | Noda et al. | ...................... | 439/70 |
| 6,450,844 B1 * | 9/2002 | Mizumura et al. | ............ | 439/884 |
| 6,575,767 B2 | 6/2003 | Satoh et al. | | |
| 7,001,197 B2 | 2/2006 | Shirai et al. | | |
| 7,182,607 B2 * | 2/2007 | Huang et al. | .................... | 439/71 |
| 2007/0173138 A1 * | 7/2007 | Lin et al. | ....................... | 439/884 |
| 2009/0047817 A1 * | 2/2009 | Liu et al. | ........................ | 439/296 |
| 2009/0253287 A1 * | 10/2009 | Polnyi et al. | .................. | 439/331 |
| 2009/0263985 A1 * | 10/2009 | Liu et al. | .......................... | 439/66 |
| 2010/0124851 A1 * | 5/2010 | Xiong et al. | .................. | 439/660 |

FOREIGN PATENT DOCUMENTS
CN    200820302788    * 11/2008
* cited by examiner

*Primary Examiner* — Chandrika Prasad
(74) *Attorney, Agent, or Firm* — Andrew C. Cheng; Wei Te Chung; Ming Chieh Chang

(57) ABSTRACT

An electrical connector comprises an insulative housing and a plurality of contacts. Each contact comprises an upper contact and a lower contact. The upper contact has a retention portion and a contact portion. The lower contact has a soldering portion and a planar board extending upwardly from the soldering portion. The lower contacts fixed to different parts of upper contacts, respectively, so as to have a larger neighbor distance than that of the upper contacts.

19 Claims, 8 Drawing Sheets

ELECTRICAL CONNECTOR WITH CONTACTS HAVING TAIL PORTIONS WITH A DIFFERENT PITCH THAN OR DISCRETE FROM CONTACT PORTIONS OF THE CONTACTS

BACKGROUND OF THE INVENTION

1. Field of the Invention

The present invention relates to a socket connector, and more particularly to a socket connector having a plurality of contacts, which includes a plurality of upper contacts engaging portions interlined with individual solder tails with different pitches.

2. Description of Related Art

With the trend toward miniaturization in electronic packages technology, contacts of sockets are arranged with high density, i.e. fine pitch arrangement. However, the existing soldering process can not match up with the socket with contacts with fine pitches.

U.S. publication No. 2007-0173138 issued to Lin et al. on Jul. 26, 2007 discloses a Land Grad Array (LGA) contact. The contact includes a base portion extending along a vertical direction, a contact portion extending upwardly from the base portion, a tail portion formed on a distal end thereof. The base portion connects the tail portion with a transitional portion, and the transitional portion comprises at least one twisted portion. The contact is integrally formed, and adjacent contact portions have a pitch that is equal to a pitch of adjacent tail portions. Thus, this contact can not be applied to the fine pitch arrangement.

U.S. Pat. No. 6,575,767 issued to Satoh et al. on Jun. 10, 2003 discloses a socket, used for testing an IC (integrated circuit) package, being applied to the fine pitch arrangement. The socket comprises a plurality of contact pins served as electrically connecting members. The contact pin comprises a spring function portion having elasticity, a contact portion which is formed on a top end side of the spring function portion and contacts with a terminal of the IC package, a conductive portion extending from an opposite side of the spring function portion, a mounting portion between the spring function portion and the conductive portion, and a connection leg portion extending from the conductive portion. A pitch of adjacent contact portions of the contact pins is smaller than that of the adjacent connection leg portions because of the conductive portions extending radially. However, the test socket contact is different to the LGA contact.

To get LGA contacts having different pitches between contact portions and tail portions, an improved contact arranged in the socket connector is required.

SUMMARY OF THE INVENTION

An object of the present invention is to provide an socket connector having contact including a plurality of upper contacts engaging portions interlined with individual solder tails with different pitches.

To achieve the aforementioned object, an electrical connector comprises an insulative housing and a plurality of contacts. Each contact comprises an upper contact and a lower contact. The upper contact has a retention portion and a contact portion. The lower contact has a soldering portion and a planar board extending upwardly from the soldering portion. The contact portions have a smaller pitch than that of the soldering portions.

To further achieve the aforementioned object, an electrical connector comprises an insulative housing and a plurality of contacts received in the insulative housing. Each contact has an upper contact with a contact portion and a lower contact with a soldering portion. The soldering portions define a pitch therebetween larger than another pitch defined by the contact portions.

Other objects, advantages and novel features of the invention will become more apparent from the following detailed description of a preferred embodiment when taken in conjunction with the accompanying drawings.

DETAILED DESCRIPTION OF THE INVENTION

Figure 1:
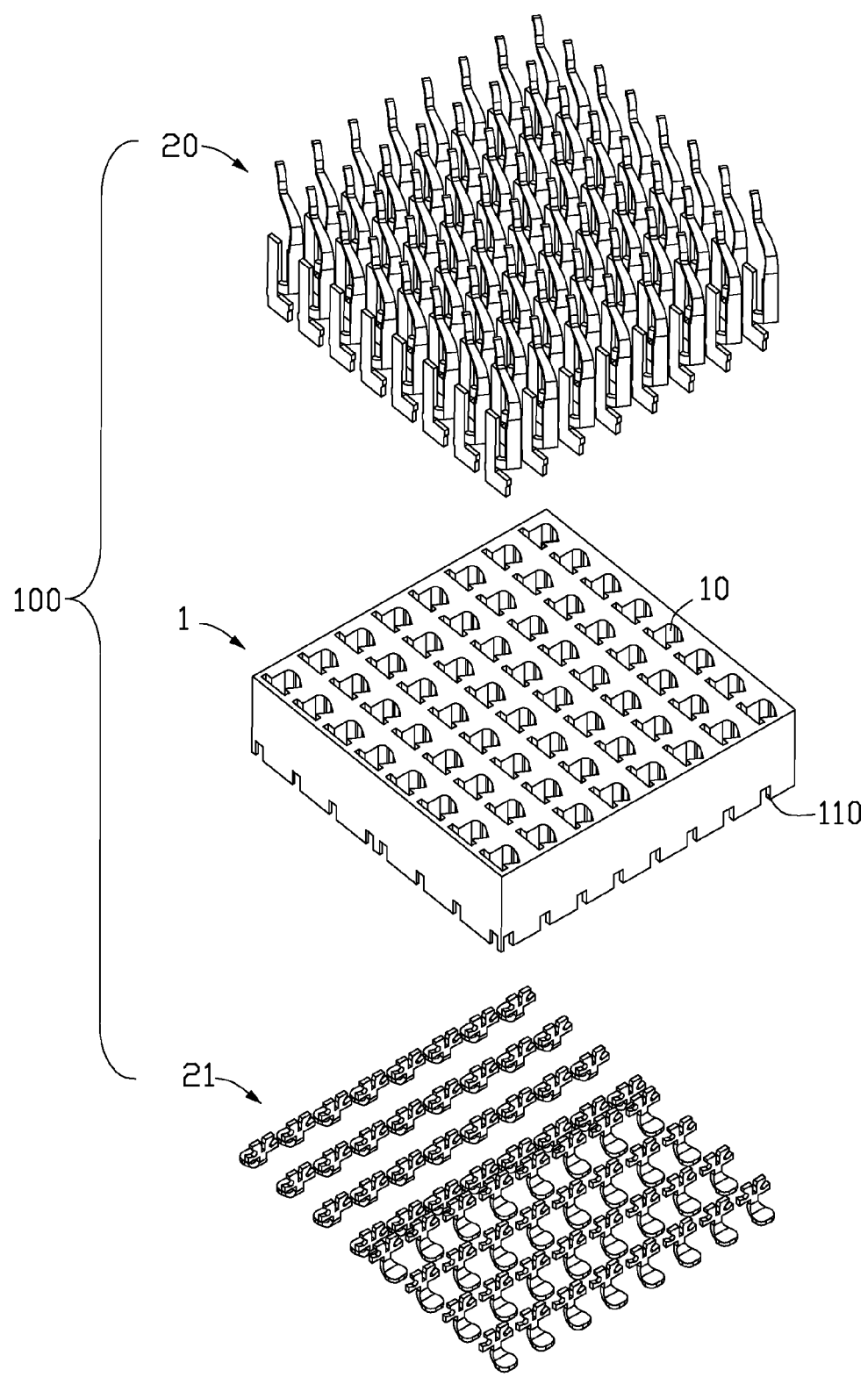
FIG. 1 is an exploded perspective view of a row of an electrical connector in accordance with the present invention.

An electrical connector in accordance with present invention is used to electrically connect with an electronic package and a printed circuit board. Conventional electrical connector substantially comprises an insulative housing, a plurality of contacts received in the insulative housing, a stiffener surrounding the insulative housing, a load plate and a lever mounted to the stiffener for locking the electronic package in the insulative housing, such as disclosed in U.S. Pat. No. 7,001,197 issued to Shirai et al. on Feb. 21, 2006, typically shown in FIGS. 1-10. In present invention, the electrical connector is similar to the conventional electrical connector, and also comprises the insulative housing, the contacts, the load plate, the stiffener, and the lever, the differences reside in the structure of the contact and the insulative housing. The following content will thoroughly describe the configuration of the contact and the insulative housing and while omitting which have been detailedly described in the conventional electrical connector. The specification is herein incorporated for reference.

Referring to FIGS. 1-8, the electrical connector 100 comprises a plurality of contacts 2 received in the insulative housing 1. The contact 2 includes an upper contact 20 and a lower contact 21. All the upper contacts 20 have a same configuration, and all the lower contacts 21 have a same configuration.

Figure 2:
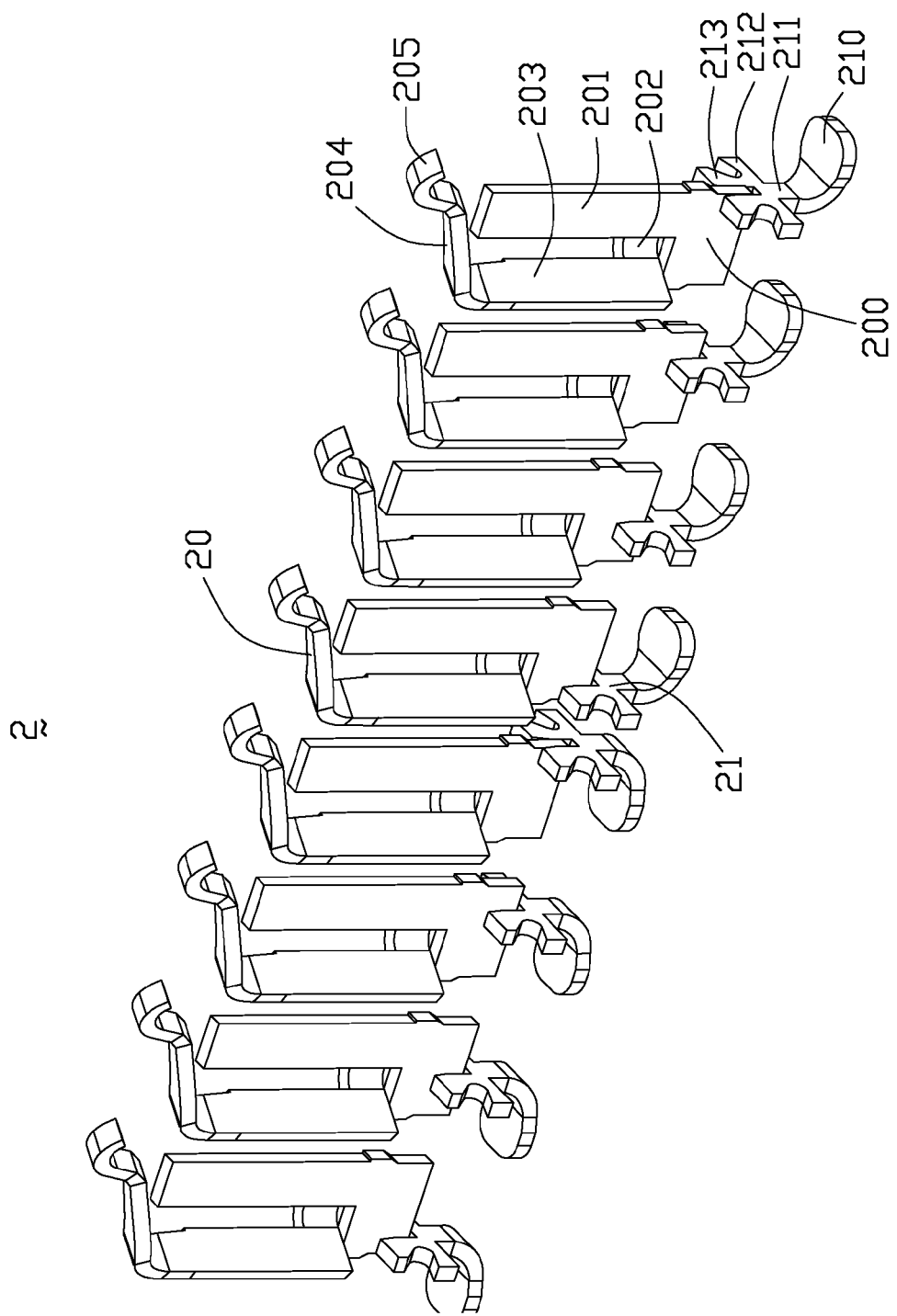
FIG. 2 is an assembled perspective view of contacts of the electrical connector shown in FIG. 1.
Figure 3:
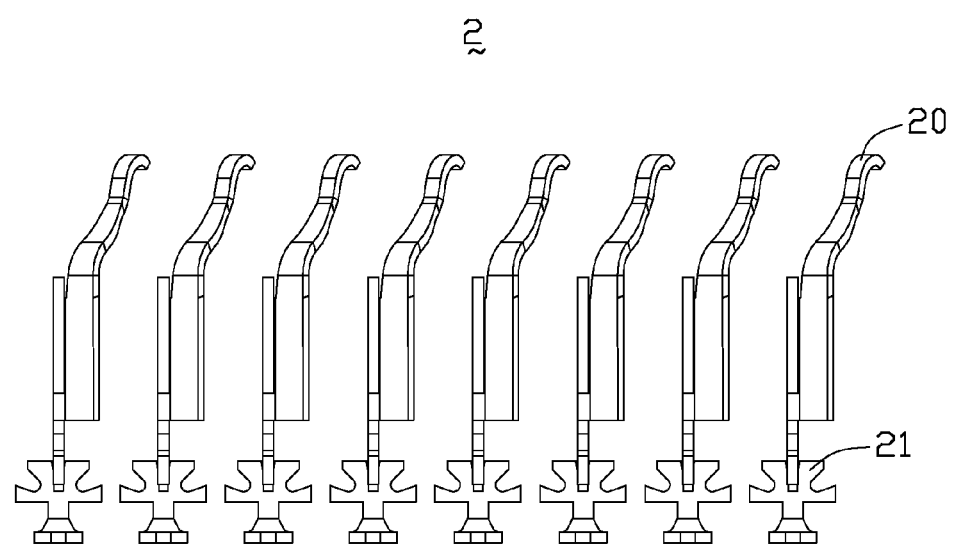
FIG. 3 is a side view of the contacts shown in FIG. 2.
Figure 4:
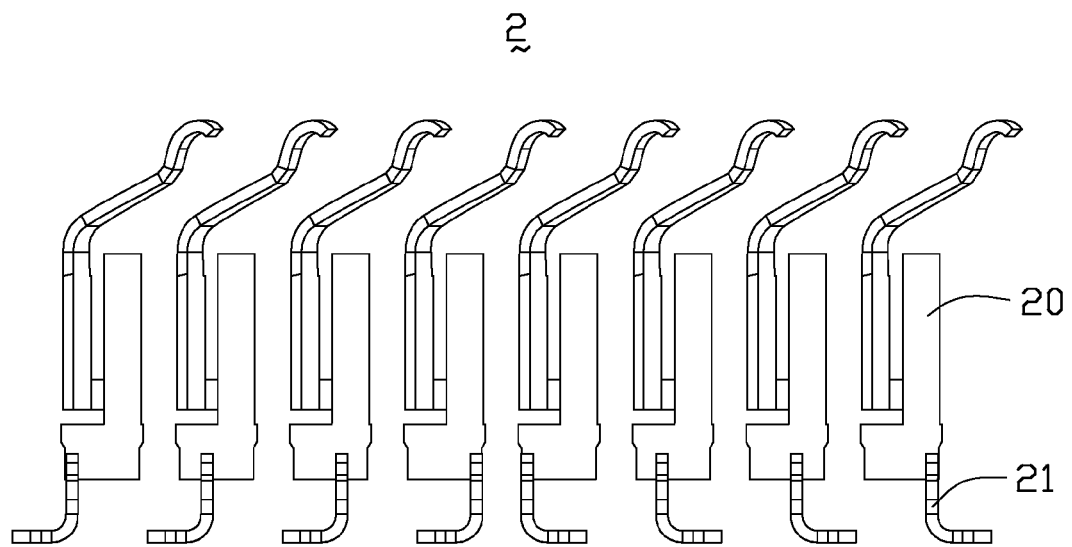
FIG. 4 is a front view of the contacts shown in FIG. 3.
Figure 5:
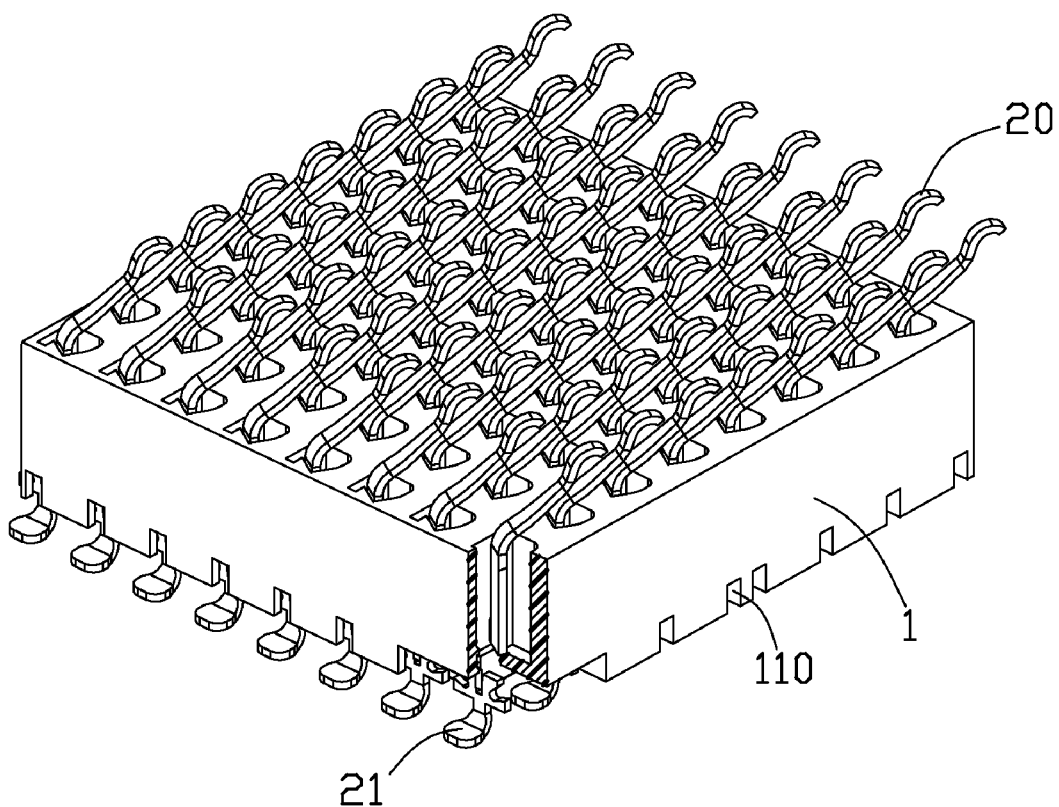
FIG. 5 is a partial cross-sectional view of the electrical connector, wherein one of the contacts is exposed in an insulative housing of the electrical connector by cutting a corner.
Figure 6:
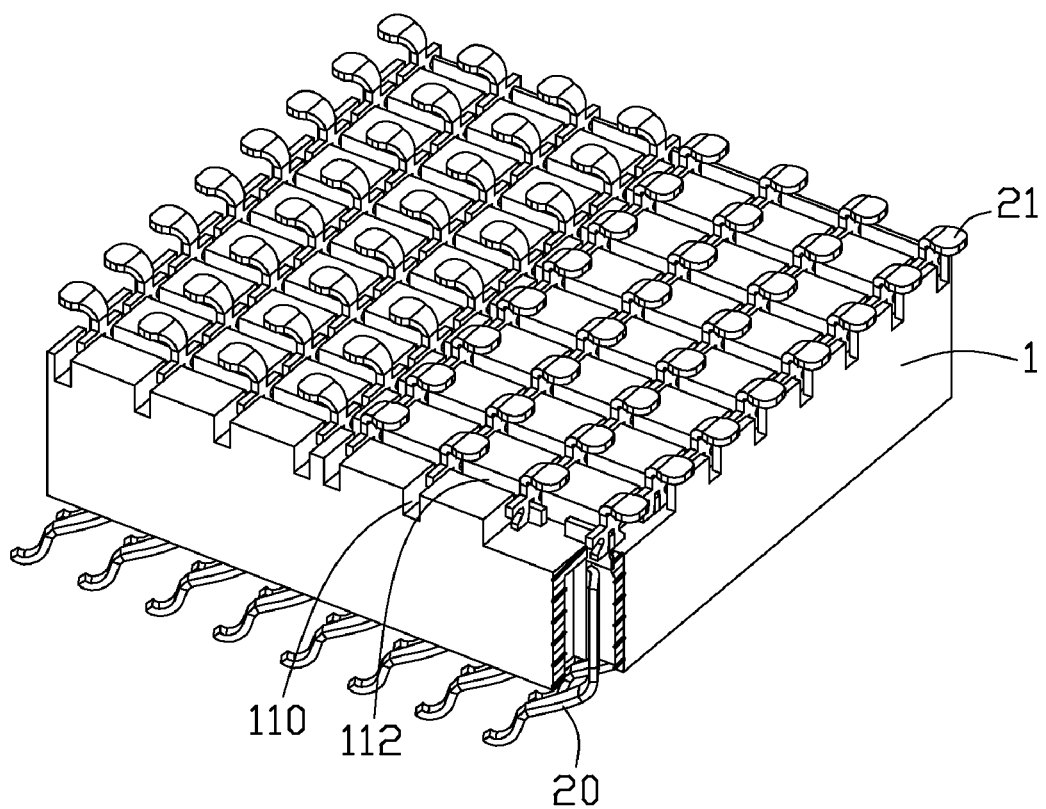
FIG. 6 is similar with FIG. 5, but taken from a bottom side.

Referring to FIGS. 2-4, the upper contact 20 has a planar retention portion 200 received in the insulative housing 1 for securing the upper contact 20 in the insulative housing 1. A connecting portion 201 extends upwardly from one side of an upper end of the retention portion 200 and is coplanar with the retention portion 200. A bias portion 203 extends upwardly and connects the connecting portion 201 with a linkage portion 202 positioned at a lower side of the connecting portion 201. A spring portion 204 is bent from a free end of the bias portion 203 and a curved contact portion 205 is disposed at a free end of the spring portion 204.

The lower contact 21 is of substantially L-shape configuration and comprises a horizontal soldering portion 210 for welding with a solder ball and a vertical planar board extending from a lateral side of the soldering portion 210. The planar board comprises a neck portion 211 extending from the soldering portion 210, a pair of securing portions 212 connecting with the neck portion 211 and horizontally oppositely disposed, and a pair of clamping portions 213 extending upwardly from the securing portions 212. The pair of clamping portions 213 have a gap therebetween to hold the retention portion 200 of the upper contact 20, so that the planar board is perpendicular to the retention portion 200.

Referring to FIGS. 5-8, the insulative housing 1 has a substantially rectangular configuration and defines a plurality of passageways 10 on a top surface for receiving the upper contacts 20. A plurality of longitudinal channels 112 and a plurality of traversal channels 110 perpendicular to the longitudinal channels 112 are defined on a bottom surface of the insulative housing 1. The longitudinal channels 112 are equably distributed on the insulative housing 1, and the traversal channels 110 are divided into two groups along a traversal line with a smallest distance allowed between two adjacent rows of the two groups. The longitudinal channels 112 are used to receive and secure the clamping portions 213 and the securing portions 212 of the lower contacts 21.

Figure 7:
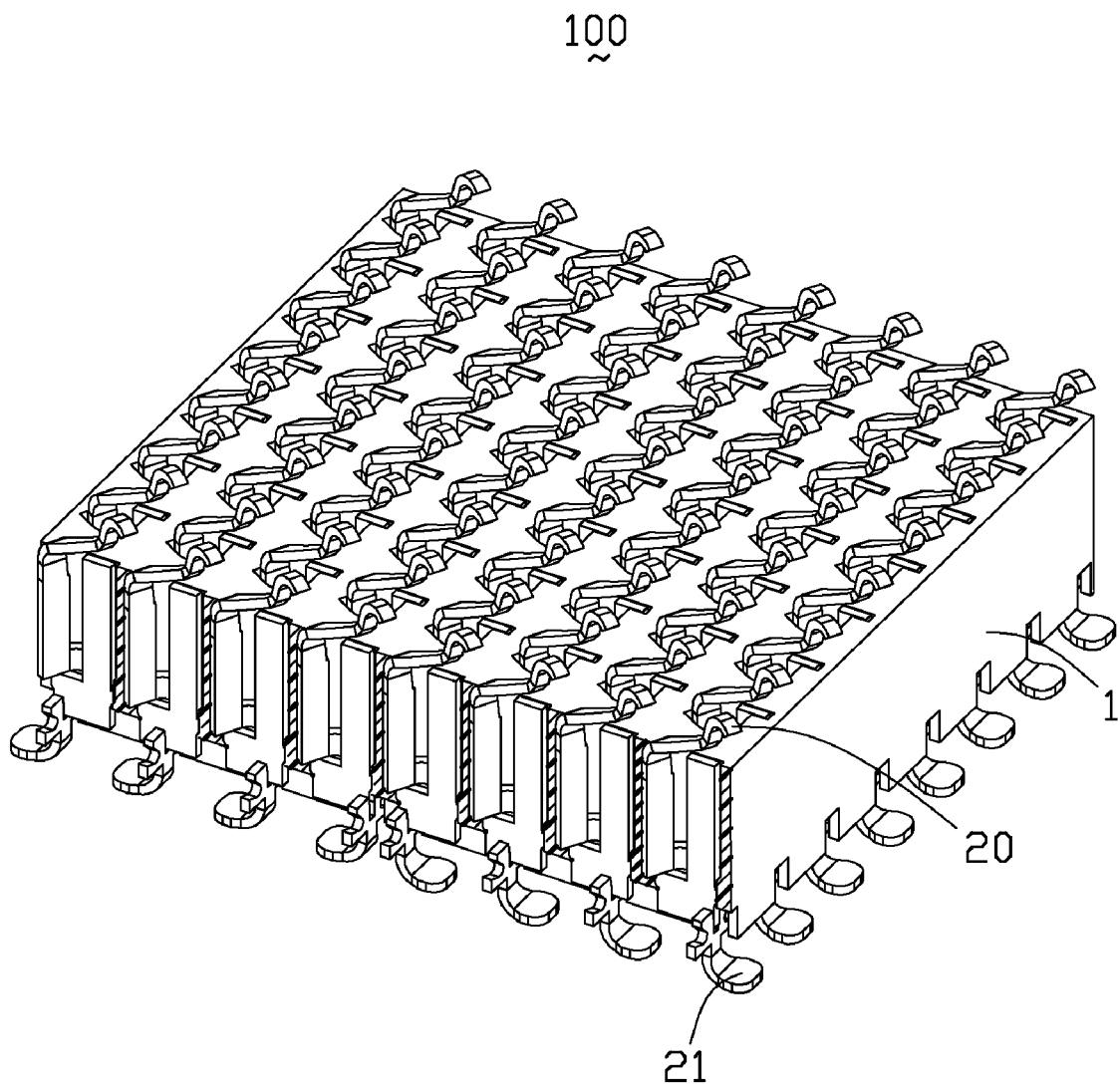
FIG. 7 is another cross-sectional view of the electrical connector, wherein a row of contacts are exposed in the insulative housing.
Figure 8:
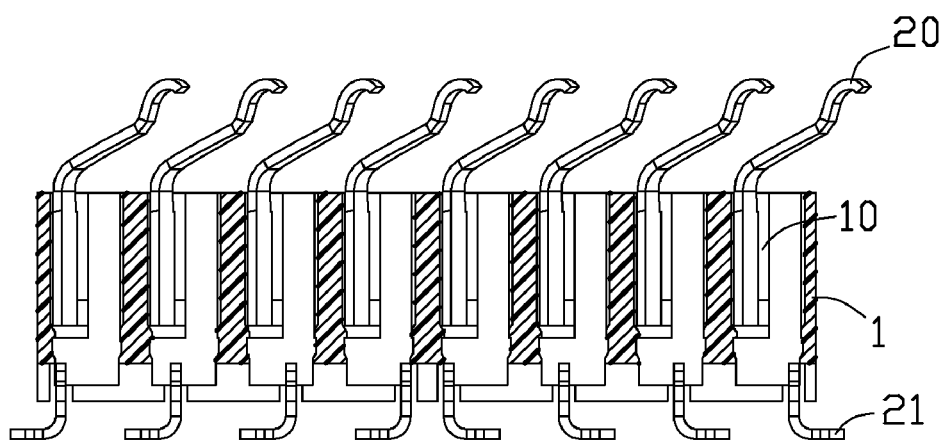
FIG. 8 is a side view of the electrical connector shown in FIG. 7.

Referring to FIGS. 7-8, they show the contacts 2 arranged in the insulative housing 1 in various views. The upper contacts 20 are assembled into the passageways 10 of the insulative housing 1 from a top-to-down direction, and the retention portion 200 is partially reached into the longitudinal channels 112 and positioned at cross areas between the longitudinal channels 112 and the traversal channels 110. The lower contacts 21 assemble into the traversal channels 110 from a down-to-top direction and each pair of clamping portions 213 of one lower contact 2 hold the retention portion of corresponding upper contact 20.

Continue to referring to FIGS. 7-8, after assembly, all the spring portions 204 and the contact portions 205 of the contacts 2 are arranged in a same way such that a same pitch is defined by adjacent upper contacts 20 in a same row. The lower contacts 21 located at two sides of the traversal line are divided into two opposite groups, the lower contacts in each group define a same pitch between the solder portions 210 in a row, and the pitches are equal between the two groups. Two neighbor soldering portions 210 of the two groups are disposed oppositely to make the two neighbor soldering portions 210 thereof also has the same pitch as that of each group defined. In this embodiment, the pitch of the contact portions 205 is smaller than the pitch of the soldering portions 210.

FIGS. 4 and 8, show that the positions where the retention 200 is clamped by the clamping portions 213 of corresponding lower contact 21 is different among different upper contacts 20 in a row of each group, so the lower contacts 21 in each group can get a different, here is a smaller, pitch therebetween, as said above, with that of the upper contact.

Although the present invention has been described with reference to particular embodiments, it is not to be construed as being limited thereto. Various alterations and modifications can be made to the embodiments without in any way departing from the scope or spirit of the present invention as defined in the appended claims.

What is claimed is:

1. An electrical connector comprising:
an isolative housing;
a plurality of contacts received in the insulative housing, each contact comprising an upper contact and a lower contact discrete from the upper contact, the upper contact having a retention portion and a contact portion, the lower contact having a planar board clamping corresponding retention portion and a solder portion extending from the planar board, two neighboring contact portions defining a smaller pitch than that of two corresponding neighboring soldering portions.

2. The electrical connector as claimed in claim 1, wherein the lower contacts arranged in a same row are divided into two groups, the lower contacts in each group define a same pitch between the soldering portions, and soldering portions of the two groups are disposed oppositely with a pitch between two neighbor soldering portions of the two group equal to that of each group.

3. The electrical connector as claimed in claim 1, wherein the planar board of the lower contact includes a neck portion extending upwardly from the soldering portion, a pair of securing portions extending oppositely from the neck portion, and a pair of clamping portions extending from the securing portions for holding the upper contact.

4. The electrical connector as claimed in claim 3, wherein the clamping portions of different lower contacts respectively hold different parts of the corresponding retention portions of the upper contacts, and the planar board is substantially perpendicular to the retention portion.

5. The electrical connector as claimed in claim 4, wherein each contact includes a spring portion extending beyond a top surface of the insulative housing and the contact portion is disposed at free end of the spring portion, and all the spring portions and the contact portions of the upper contacts are arranged in a same way so that the upper contacts in a row have a same pitch.

6. The electrical connector as claimed in claim 5, wherein the lower contacts in a same row are divided into two groups by a traversal line of the insulative housing, and one group of the soldering portions are disposed oppositely to that of the other group, and all the soldering portions has a same pitch.

7. The electrical connector as claimed in claim 4, wherein a plurality of longitudinal channels and a plurality of traversal channels perpendicular to the longitudinal channels are defined on a bottom surface of the insulative housing to receive the lower contacts.

8. The electrical connector as claimed in claim 7, wherein the longitudinal channels are equably distributed on the insulative housing, the traversal channels are divided into two groups along a traversal line, and two adjacent rows of the two groups have a smallest distance.

9. The electrical connector as claimed in claim 8, wherein the retention portion of the upper contact partially reaches into the longitudinal channels and is positioned at cross areas between the longitudinal channels and the traversal channels.

10. An electrical connector comprising:
an insulative housing;
a plurality of contacts received in the insulative housing, each contact having an upper contact with a contact portion and a lower contact with a soldering portion, the upper contacts defining a pitch between two neighboring contact portions and the lower contacts defining a pitch between two neighboring soldering portions which is larger than the pitch defined by the neighboring contact portions in a same row.

11. The electrical connector as claimed in claim 10, wherein all the upper contacts have a same configuration, and all the lower contacts have a same configuration, the lower contacts being fixed to different parts of upper contacts, respectively, so as to have a neighbor distance larger than that of the upper contacts.

12. The electrical connector as claimed in claim 11, wherein upper contact includes a retention portion for securing the upper contact in the insulative housing, and the contact portion connects with the retention portion.

13. The electrical connector as claimed in claim 12, wherein the lower contact includes a planar board perpendicular to the soldering portion, the planar board includes a neck portion extending upwardly from the soldering portion, a pair of securing portions extending oppositely from the neck portion, and a pair of clamping portions extending from the securing portions for holding the retention portion.

14. The electrical connector as claimed in claim 13, wherein the lower contacts are divided into two groups, and the soldering portions of the lower contacts are oppositely located in the two groups.

15. An electrical connector comprising:
   an insulative housing defining a plurality of contact receiving passageways arranged in rows;
   a plurality of contacts disposed in the contact receiving passageways, respectively;
   each of said contacts including an upper contact part with a contacting section thereof and a lower contact part with a soldering section thereof; wherein
   said upper contact part and said lower contact part are initially discrete from each other while being not only subsequently assembled to each other but also individually and respectively restrained by the housing for assuring respective positions with regard to the housing.

16. The electrical connector as claimed in claim 15, wherein positioning relation between the lower contact parts and the corresponding upper contact parts is variant along a direction of said row.

17. The electrical connector as claimed in claim 16, wherein a pitch of the solder sections is essentially larger than that of the contacting section in each row.

18. The electrical connector as claimed in claim 15, wherein in each row of said contacts, the contacting sections extend in a same direction while the soldering sections are arranged with two opposite groups extending in opposite directions.

19. The electrical connector as claimed in claim 10, the upper contact is discrete from the lower contact.

\* \* \* \* \*